(12) United States Patent
Hwang et al.

(10) Patent No.: US 10,887,986 B2
(45) Date of Patent: Jan. 5, 2021

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Mi-Sun Hwang, Suwon-si (KR); Sun-A Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/676,499

(22) Filed: Nov. 7, 2019

(65) Prior Publication Data

US 2020/0178390 A1 Jun. 4, 2020

(30) Foreign Application Priority Data

Dec. 4, 2018 (KR) .................. 10-2018-0154334

(51) Int. Cl.
| | |
|---|---|
| *H05K 1/11* | (2006.01) |
| *H05K 3/40* | (2006.01) |
| *H05K 3/42* | (2006.01) |
| *H05K 3/00* | (2006.01) |

(52) U.S. Cl.
CPC .......... *H05K 1/113* (2013.01); *H05K 3/0094* (2013.01); *H05K 3/4038* (2013.01); *H05K 3/423* (2013.01); *H05K 2201/0394* (2013.01)

(58) Field of Classification Search
CPC ........ H05K 1/113; H05K 1/112; H05K 1/115; H05K 1/116; H05K 1/184; H05K 3/4038
See application file for complete search history.

(56) References Cited

U.S. PATENT DOCUMENTS

| | | | | |
|---|---|---|---|---|
| 4,840,923 A | * | 6/1989 | Flagello | ............. H01L 21/4846 148/DIG. 164 |
| 6,010,769 A | * | 1/2000 | Sasaoka | ............. H01L 21/4857 428/209 |
| 2005/0012217 A1 | * | 1/2005 | Mori | ................ H01L 23/49822 257/758 |
| 2005/0136646 A1 | * | 6/2005 | Larnerd | ................ H05K 1/115 438/629 |

FOREIGN PATENT DOCUMENTS

| | | |
|---|---|---|
| JP | 2002-359446 A | 12/2002 |
| JP | 5005416 B2 | 8/2012 |

* cited by examiner

*Primary Examiner* — Jeremy C Norris
(74) *Attorney, Agent, or Firm* — NSIP Law

(57) ABSTRACT

A printed circuit board includes an insulating layer, a pad, and a via fill. The insulating layer includes a via hole. The pad is formed in the insulating layer such that an intermediate portion thereof is exposed by the via hole. The pad includes a through hole formed in the intermediate portion. The via fill is formed in the via hole, configured to fill the through hole, and coupled to the intermediate portion.

16 Claims, 6 Drawing Sheets

PRINTED CIRCUIT BOARD AND METHOD OF MANUFACTURING THE SAME

CROSS-REFERENCE TO RELATED APPLICATION

This application claims the benefit under 35 USC 119(a) of Korean Patent Application No. 10-2018-0154334 filed on Dec. 4, 2018, in the Korean Intellectual Property Office, the entire disclosure of which is incorporated herein by reference for all purposes.

BACKGROUND

1. Field

The following description relates to a printed circuit board and a method of manufacturing the same.

2. Description of Related Art

Along with the miniaturization and thin-filming of electronic devices such as a mobile device and a notebook, there is an increasing demand for small and thin printed circuit boards.

In order to form vias which connect layers in a thin printed circuit board, an efficient processing technique for via holes is required. In addition, vias having excellent electrical and mechanical properties are in demand.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes an insulating layer, a pad, and a via fill. The insulating layer includes a via hole. The pad is formed in the insulating layer such that an intermediate portion thereof is exposed by the via hole. The pad includes a through hole formed in the intermediate portion. The via fill is formed in the via hole, configured to fill the through hole, and coupled to the intermediate portion.

The intermediate portion of the pad may taper towards the through hole.

The via hole may include opposing via holes formed to expose opposing surfaces of the intermediate portion. A pair of via fills may be connected to each other through the through hole.

Opposing surfaces of the intermediate portion may be formed to be slope upward towards the through hole.

The intermediate portion may taper towards the through hole and slope upwards.

In another general aspect, a method of manufacturing a printed circuit board includes forming an insulating layer with a pad embedded therein, selectively removing the insulating layer using an abrasive material to form a via hole exposing an intermediate portion of the pad, and filling the via hole with a conductive material to form a via fill. The forming of the via hole includes using the abrasive material to form a through hole in the intermediate portion of the pad.

The forming of the via hole may further include disposing a mask having a through hole corresponding to a location of the via hole on the insulating layer, and performing a sandblasting process using the abrasive material on the insulating layer.

The forming of the via hole may include performing a sandblasting process using the abrasive material on opposing surfaces of the insulating layer to form a pair of via hole connected to each other through the through hole to expose opposing surfaces of the intermediate portion, and forming a pair of via fills connected to each other through the through hole of the intermediate portion.

The sandblasting process may be simultaneously performed on the opposing surfaces of the insulating layer.

The sandblasting process may be sequentially performed on one surface and another surface of the insulating layer.

In another general aspect, a printed circuit board includes an insulating layer, a pad, and a via fill. The insulating layer includes a via hole. The pad is disposed in the insulating layer and configured to protrude a portion of the pad from side surfaces of the via hole. The pad includes a through hole in the portion of the pad. The via fill is disposed to fill the via hole and the through hole, and coupled to the portion of the pad.

The portion of the pad may taper towards the through hole.

The via hole may include opposing via holes formed on opposing surfaces of the portion, and via fills may connect to each other through the through holes.

The portion of the pad may slope upwards toward the through hole.

The portion of the pad may slope downwards toward the through hole.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
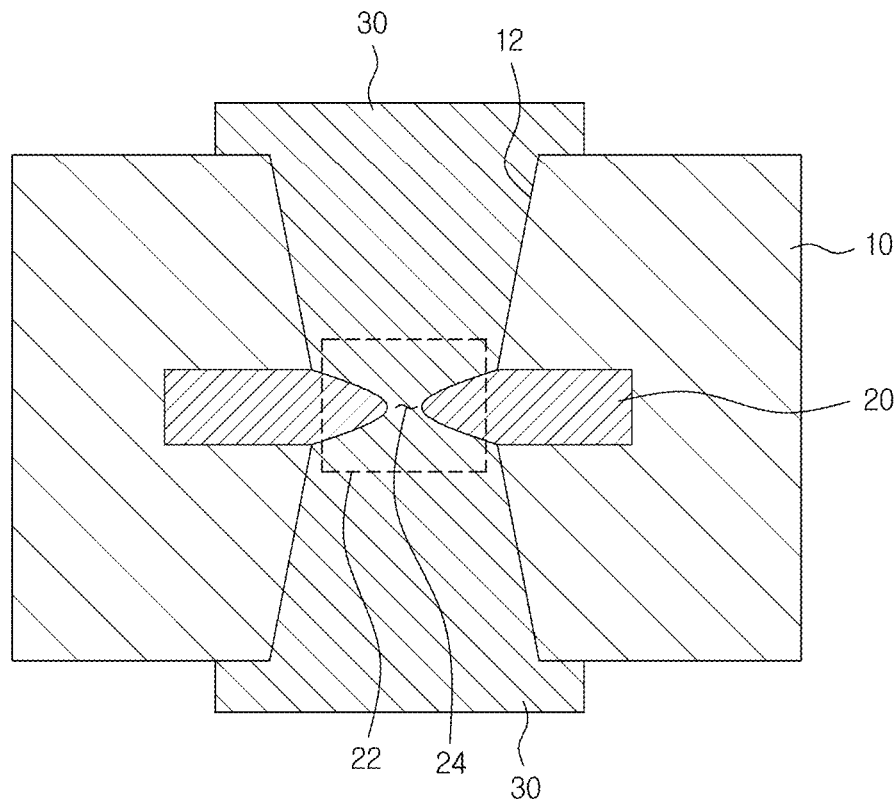
FIG. 1 is a diagram showing an example of a printed circuit board.
Figure 2:
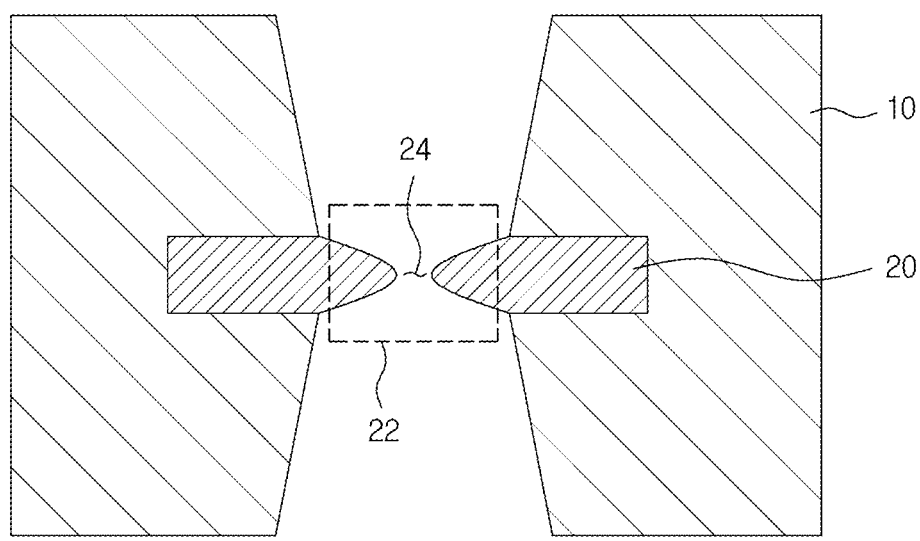
FIG. 2 is a diagram showing an example of a pad of the printed circuit board.
Figure 3:
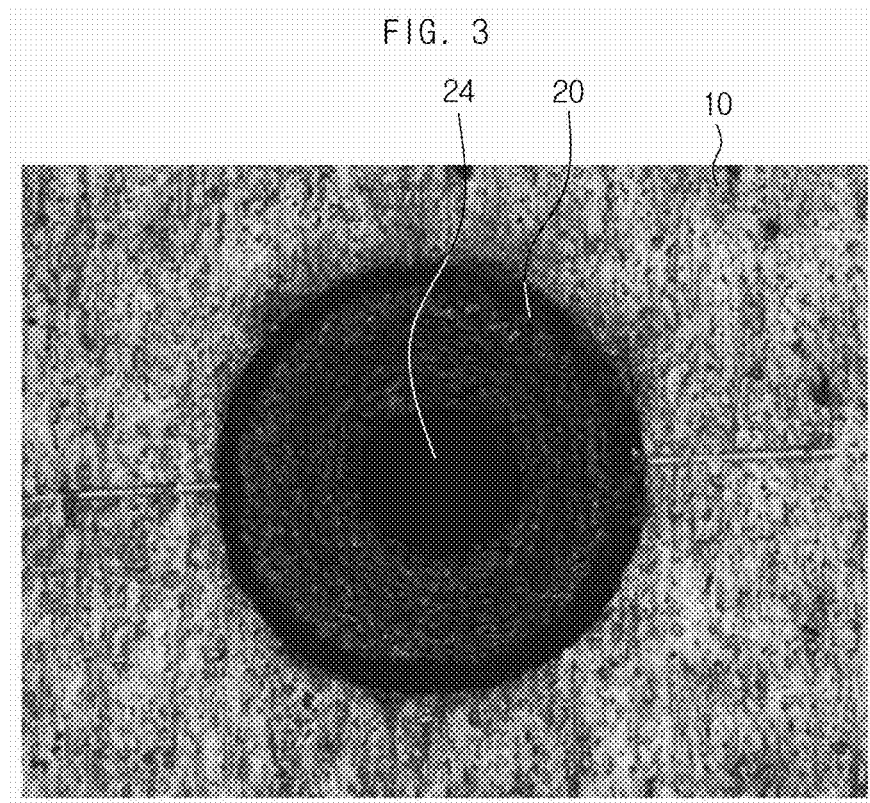
FIG. 3 is a photograph showing an example of a via hole of the printed circuit board.

FIG. 1 is a diagram showing an example of a printed circuit board (PCB), FIG. 2 is an example of a diagram showing a pad of the PCB, and FIG. 3 is an example of a photograph showing a via hole of the PCB.

Referring to FIG. 1, the PCB includes an insulating layer 10, a pad 20, and a via fill 30.

The insulating layer 10 may be formed by stacking insulating materials, and a circuit pattern including the pad 20 may be formed in the insulating layer 10. For interlayer connection of the circuit pattern, a via hole 12 to be filled with the via fill 30 may be formed in the insulating layer 10.

Referring to FIG. 1, in an example, the pad 20 may be disposed inside the insulating layer 10. In this example, via holes 12 may be formed on opposing surfaces of the insulating layer 10, and surfaces of the pad 20 may be exposed through the via holes 12 formed on opposing surfaces of the insulating layer 10.

The insulating layer 10 may include a variety of insulating materials, such as thermosetting resin, photosensitive resin, and the like. In order to improve mechanical properties and electrical properties, such as strength, a thermal expansion rate, and the like, the insulating layer 10 may include various reinforcing materials, such as fibers, fillers, and the like.

Also, the insulating layer 10 may be formed on another insulating layer or may be formed as a portion of a build-up layer that includes several insulating layers.

The pad 20 may be a portion of the circuit pattern and may be disposed in the insulating layer 10 and connected to the via fill 30. The pad 20 may be formed by different circuit pattern forming methods that include plating. The pad 20, according to this example, has a center portion 22 exposed by the via hole 12 of the insulating layer 10. The pad 20 has a structure in which a through hole 24 is formed in the center portion 22. The center portion 22 of the pad 20 may be an intermediate portion of the pad 20.

Referring to FIGS. 2 and 3, the pad 20 may be disposed in a central portion of the insulating layer 10. The center portion 22 of the pad 20 may be exposed through the via hole 12 when the via hole 12 is not filled with the via fill 30. The via holes 12 may be formed on opposing surfaces of the insulating layer 10 to expose both surfaces of the pad 20.

In this example, the through hole 24 is formed in the center portion 22 so that the via holes 12 formed on opposing sides of the center portion 22 of the pad 20 may communicate with each other.

For example, the center portion 22 may have the through hole 24 formed at the center and have a thickness that tapers toward the through hole 24. That is, the pad 20 may have a thickness decreasing from a peripheral portion of the pad 20 to the center where the through hole 24 is formed. In an example, the center portion 22 may have opposing surfaces formed with concavity toward the through hole 24 to slope downwards. The concave structure of the center portion 22 widens the surface area to be coupled to the via fill 30, allows the via fill 30 to be inserted into and coupled to the pad 20 and thus may serve to increase coupling strength of the via fill 30 to the pad 20.

The via fill 30 is formed in the via hole 12 of the insulating layer 10 and coupled to the pad 20. The via fill 30 is formed also to fill the through hole 24 formed in the center portion 22 of the pad 20. The via fill 30 may be formed by plating the via hole 12 with a metal or by filling the via hole 12 with a conductive paste.

Referring to FIG. 1, according to this example, an end of the via fill 30 may be inserted into and coupled to the through hole 24 of the center portion 22 of the pad 20. That is, a metal or conductor constituting the via fill 30 may be inserted into and coupled to the through hole 24 of the center portion 22 of the pad 20. Such a structure may increase the coupling strength of the via fill 30 to the pad 20.

In particular, according to this example, the through hole 24 is formed in the center portion 22 of the pad 20, and the via holes 12 at opposing sides of the pad 20 are connected through the through hole 24 of the center portion 22. Also, a pair of vias 30 facing opposing surfaces of the center portion 22 may be coupled to each other, and the pair of vias 30 may be directly connected through the through hole 24. Accordingly, circuit patterns disposed on opposing surfaces of the insulating layer 10 may be reliably connected through the pad 20 and the pair of vias 30.

Figure 4:
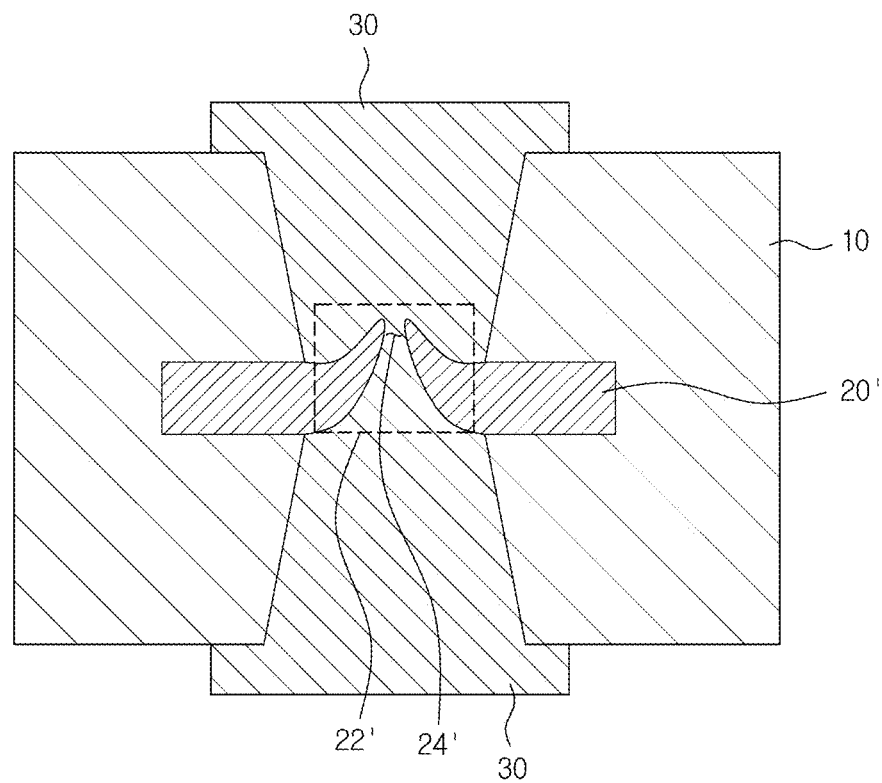
FIG. 4 is a diagram showing an example of a printed circuit board.
Figure 5:
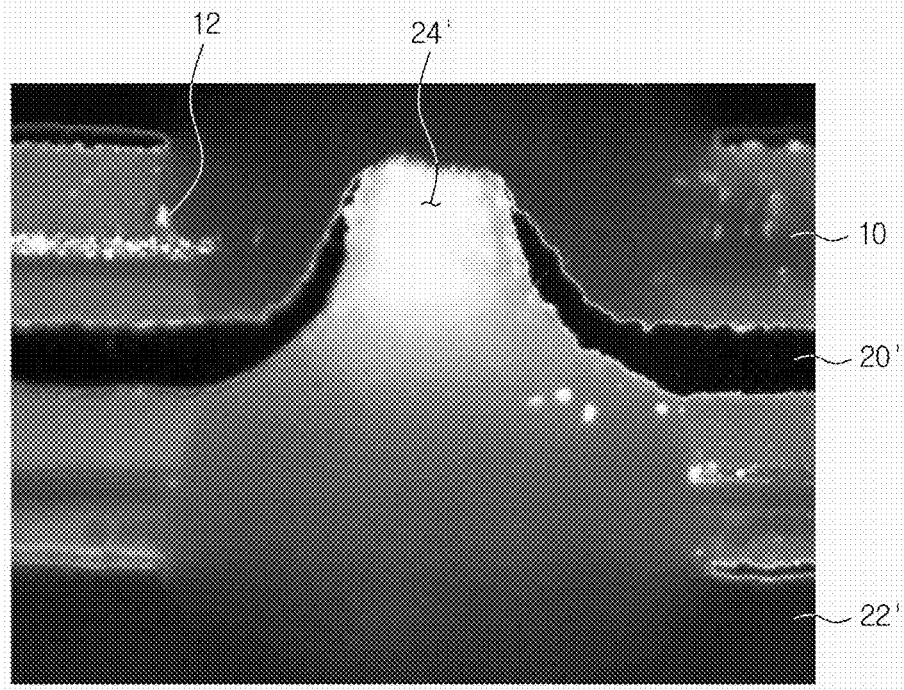
FIG. 5 is a photograph showing an example of a via hole of the printed circuit board.

FIG. 4 is a diagram showing an example of a PCB, and FIG. 5 is a photograph showing an example of a via hole 12 of the PCB.

Referring to FIGS. 4 and 5, a center portion 22' has one surface formed to be convex toward a through hole 24' and another surface formed to be concave toward the through hole 24'. In a pad 20', the one surface of the center portion 22' may be formed to have a convex shape, and the other surface of the center portion 22' may be formed to have a concave shape corresponding to the convex shape. That is, the pad 20' may be formed in a horn-like structure in which the center portion 22' of the pad 20' protrudes to one surface of the pad 20'. The concave surface and the convex surface of the pad 20' widen the surface area to be coupled to the via fill 30 and thus may serve to increase coupling strength of the via fill 30 to the pad 20'.

Figure 6:
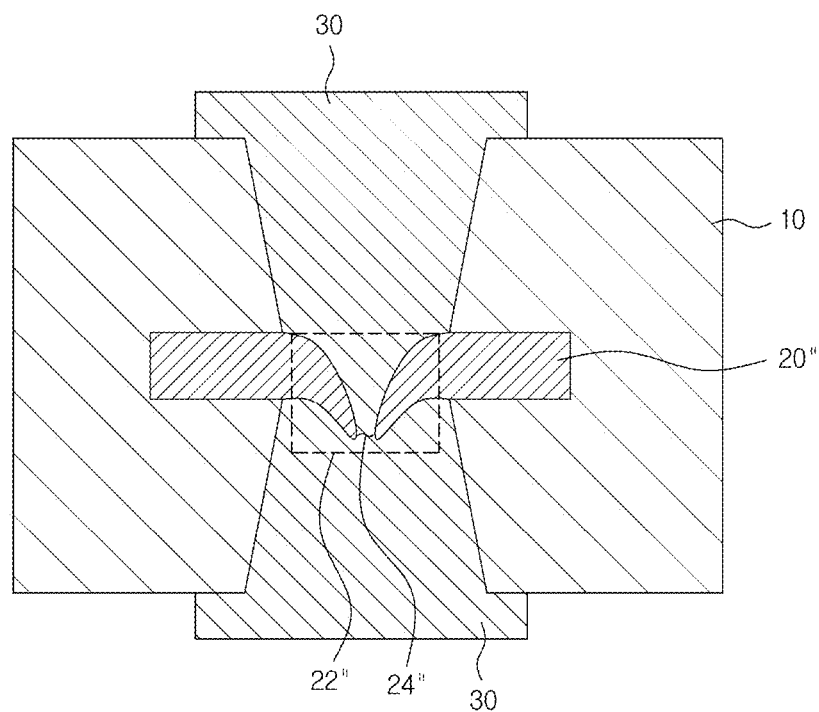
FIG. 6 is a diagram showing an example of a printed circuit board.

FIG. 6 is a diagram showing an example of a PCB. Referring to FIG. 6, unlike the example of FIGS. 4 and 5, a pad 20" may have a horn-like structure in which a center portion 22" protrudes to the other surface of the pad 20". The center portion 22" may have one surface formed to be concave toward a through hole 24" and the other surface formed to be convex toward the through hole 24".

Figure 7:
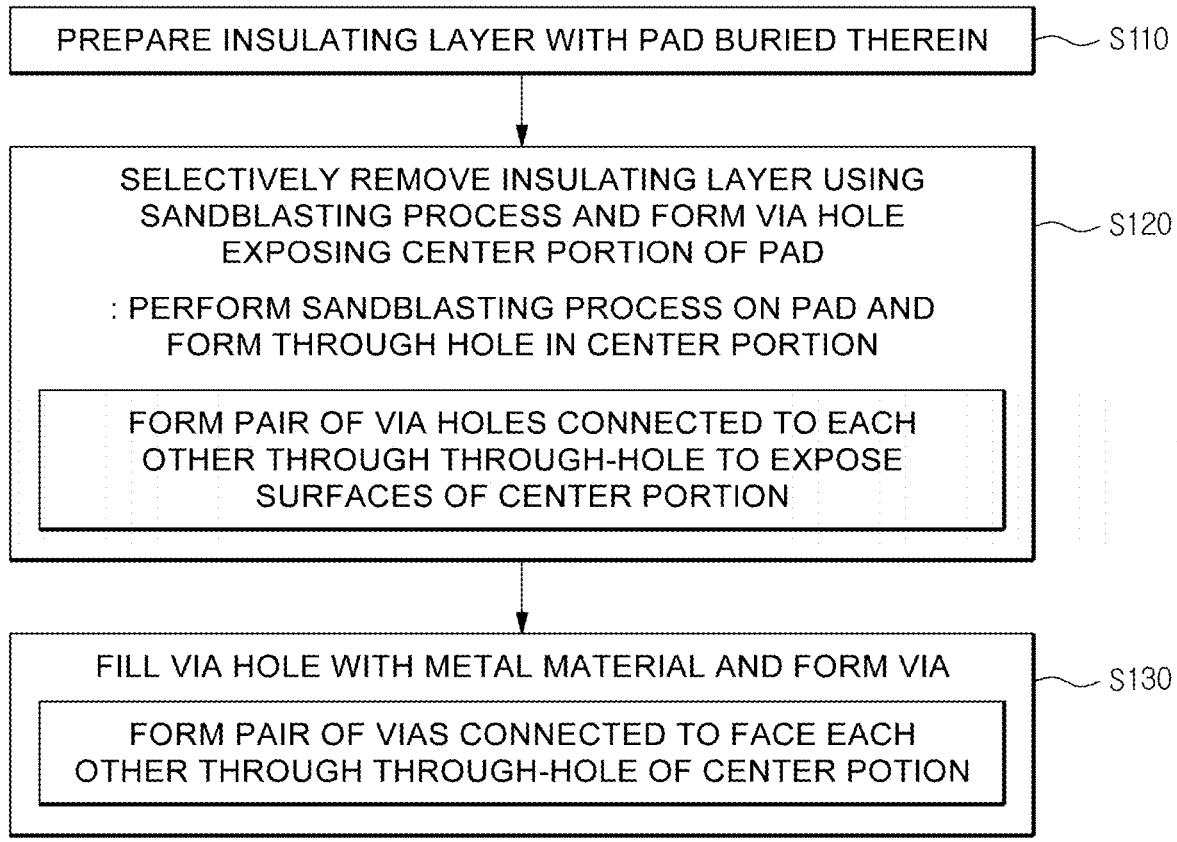
FIG. 7 is a flowchart showing an example of a method of manufacturing the printed circuit board.

FIG. 7 is a flowchart showing an example of a method of manufacturing the PCB, and FIGS. 8 to 11 are diagrams illustrating an example of a method of manufacturing the PCB.

Referring to FIGS. 7 to 11, the method of manufacturing the PCB includes preparing or forming an insulating layer 110 (S110), forming a via hole 112 (S120), and forming a via 130 (S130).

The preparing or forming of the insulating layer 110 (S110) includes forming the insulating layer 110 in which a pad 120 is buried.

Figure 8:
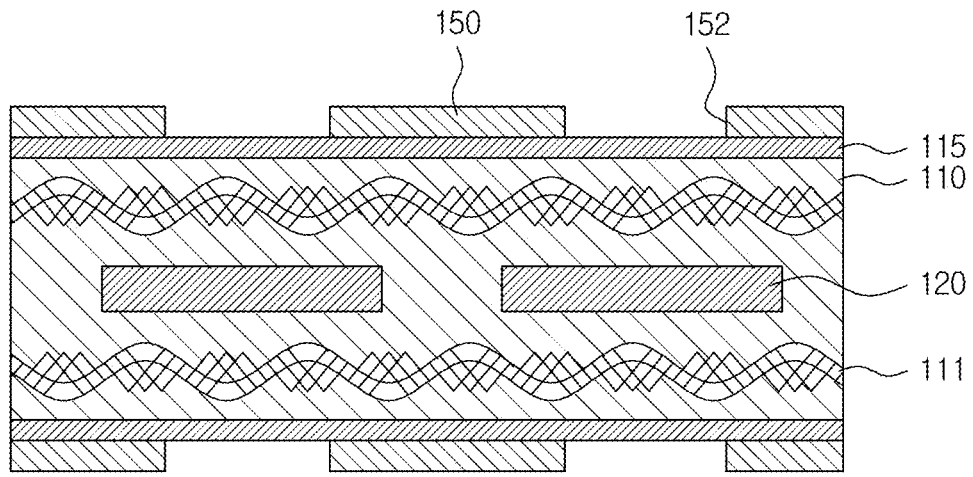
FIGS. 8 to 11 are diagrams illustrating examples of a method of manufacturing the printed circuit board.

Referring to FIG. 8, the insulating layer 110 may be formed to have the pad 120 disposed at a central portion therein. The insulating layer 110 may be formed by stacking one or more insulating materials, such as thermosetting resin, photosensitive resin, and the like. In order to improve mechanical properties and electrical properties, such as strength, a thermal expansion rate, and the like, the insulating layer 110 may include various reinforcing materials 111, such as fibers, fillers, and the like.

Also, after the pad 120 is formed by stacking insulating materials, the pad 120 buried in the insulating layer 110 may be formed by stacking insulating materials again on the pad 120. In this example, a metal layer 115 may be stacked on opposing surfaces of the insulating layer 110. Subsequently, the metal layer 115 may be selectively etched to form a circuit pattern.

In this example, a method of preparing the insulating layer 110 by forming the pad 120 on an insulating material and then stacking an insulating material again on the pad 120 is illustrated, but the present example is not limited thereto, and various methods of forming the pad 120 on the insulating layer 110 may be used. The pad 120 may be formed using a plating method and/or other known circuit pattern forming methods (e.g., metal paste sintering).

The via hole 112 (S120) may be formed by selectively removing the insulating layer 110 using a sandblasting process to form the via hole 112 exposing the pad 120. Further, the sandblasting process may be performed on the pad to form a through hole 124 in a center portion 122 of the pad 120.

The sandblasting process may involve the spraying of abrasive material from a nozzle to grind or cut a material surface. While sand was sprayed as the abrasive material in the past, hence "sandblasting," the process now includes spraying various particles such as ceramic powder, including alumina (aluminum oxide) or silicon carbide, glass beads, plastic powder and the like as the abrasive material. There are two types of sandblasting: wet sandblasting that mixes an abrasive material and water and then sprays the mixture from a nozzle; and air sandblasting that sprays only the abrasive material from a nozzle using air.

For example, in this example, particles 155, such as silicon carbide, may be used as the abrasive material for the sandblasting process. The via hole 112 exposing the pad 120 may be formed by spraying the particles 155 on a portion of the insulating layer 110 with the pad 120 buried therein to form a hole in the insulating layer 110.

When the via hole 112 is formed by sandblasting the insulating layer 110, a wall surface with a low surface roughness may be formed in the via hole 112 to allow for smoother processing of reinforcing material 111 of the insulating layer 110 without protruding from the wall surface of the via hole 112. Thus, since the outer surface of the via 130 formed in the via hole 112 has a low surface roughness, the loss of signals transferred through the via 130 may be reduced, and thus it is possible to enhance radio frequency (RF) characteristics.

Figure 9:
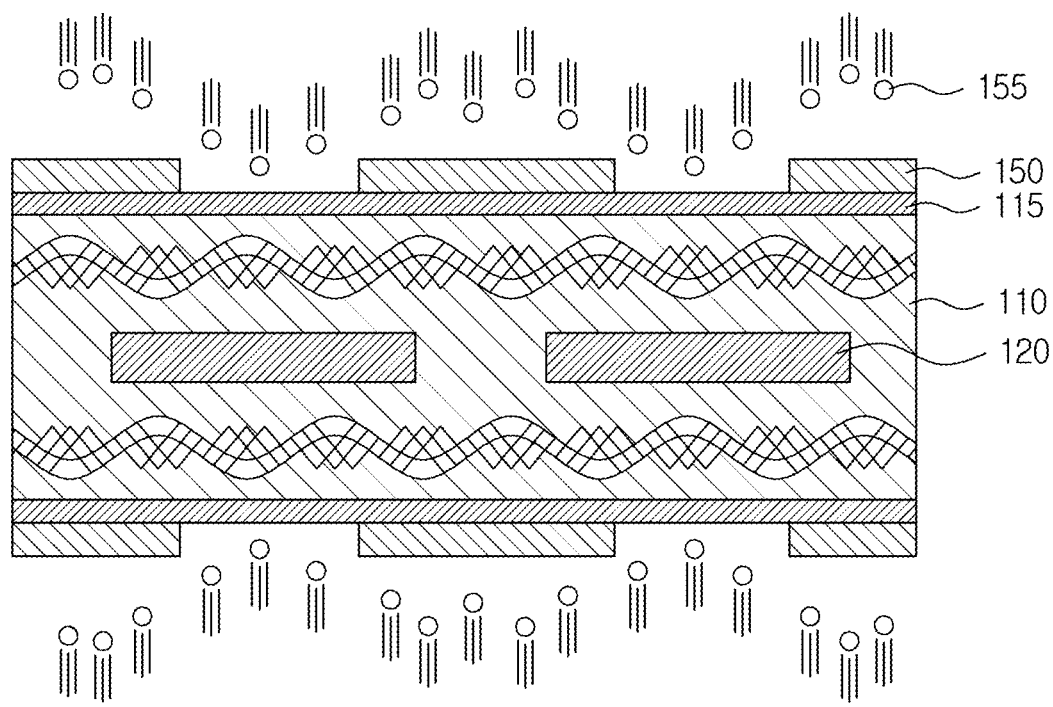

Referring to FIG. 9, the via hole 112 may be formed by stacking, on the insulating layer 110, a sandblast mask 150 with a through hole 152 formed to correspond to a location of the via hole 112 and then performing a sandblasting process on the insulating layer 110 on which the sandblast mask 150 is stacked. A portion of the insulating layer 110 covered with the sandblast mask 150 remains intact while the via hole 112 is being created at the through hole 152. After the sandblasting process, the sandblast mask 150 may be removed.

In this example, by performing the sandblasting process on opposing surfaces of the insulating layer 110 to expose opposing surfaces of the center portion 122, a pair of via holes 112 facing each other with respect to the pad 120 may be formed.

Figure 10:
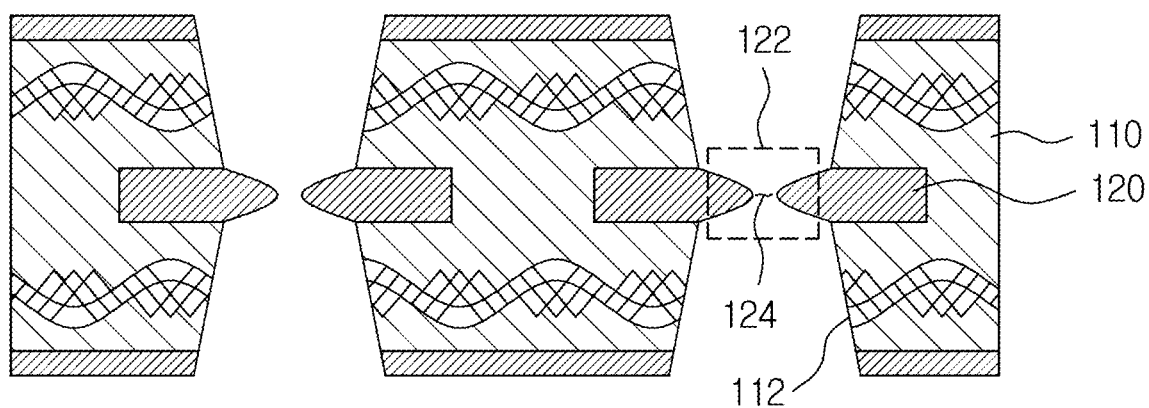

Referring to FIG. 10, the sandblasting process may also be performed on the pad 120 to form the through hole 124 in the center portion 122 of the pad 120 simultaneously with or after the formation of the via hole 112. When the sandblasting process is performed on the pad 120, the through hole 124, as well as a concave structure, may be formed. The concave structure of the sandblasted center portion 122 in which the through hole 124 is formed widens the surface area to be coupled to the via 130 and allows the via 130 to be inserted into and coupled to the pad 120, and thus may serve to increase coupling strength of the via 130 to the pad 120.

In this example, the sandblasting process may be simultaneously performed on opposing surfaces of the insulating layer 110 or may be sequentially performed on the surfaces of the insulating layer 110. One or both surfaces of the center portion 122 of the pad 120 may be formed to be concave depending on the strength or order of the sandblasting process performed on the opposing surfaces of the insulating layer 110. Also, the pad 120 may have one surface formed to be concave, and the other surface formed to be convex.

The forming of the via 130 (S130) includes filling the via hole 112 with a metal material to form the via fill 130.

Figure 11:
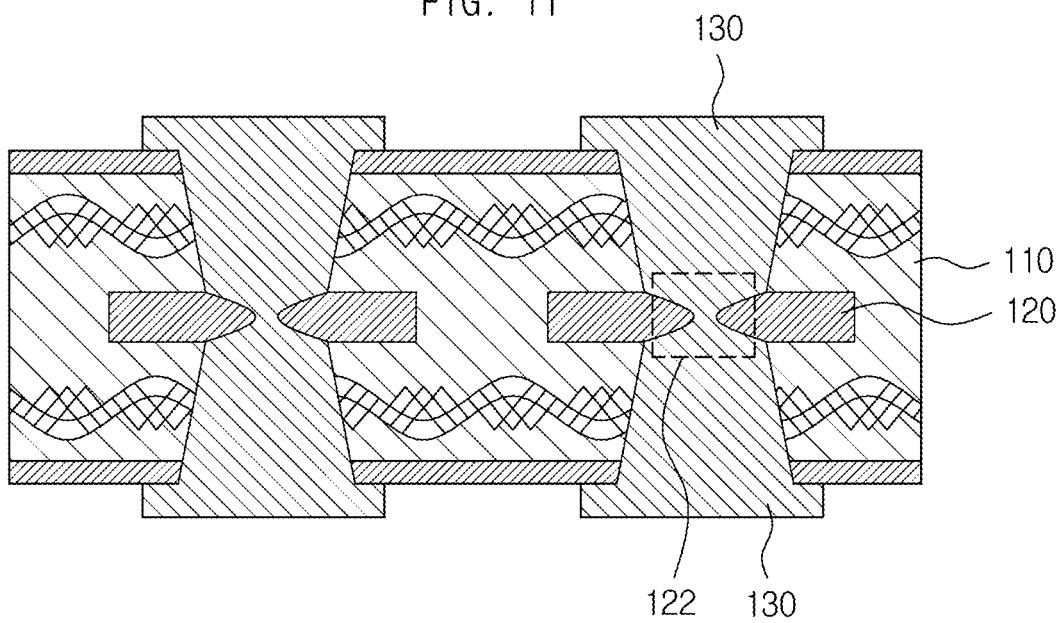

Referring to FIG. 11, according to this example, the pair of vias 130 connected to the center portion 122 of the pad 120, each facing the other, may be formed. In this example, the through hole 124 is formed in the center portion 122 so that the pair of vias 130 opposing each other may be directly connected to each other through the through hole 124. Accordingly, circuit patterns disposed on opposing surfaces of the insulating layer 110 may be reliably connected to each other through the pad 120 and the pair of vias 130.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
an insulating layer comprising a via hole having an hour-glass contour; a pad formed at an intermediate portion in the insulating layer such that an intermediate portion of the pad is exposed at an intermediate surface portion of the via hole, the pad comprising a through hole formed in the intermediate portion of the pad; and a via fill formed in the via hole, configured to fill the through hole, and coupled to the intermediate portion of the pad.

2. The printed circuit board of claim 1, wherein the intermediate portion of the pad tapers towards the through hole.

3. The printed circuit board of claim 1, wherein the via hole comprises opposing via holes formed to expose opposing surfaces of the intermediate portion of the pad, and a pair of via fills connect to each other through the through hole.

4. A printed circuit board, comprising: an insulating layer comprising a via hole; a pad formed in the insulating layer such that an intermediate portion thereof is exposed by the via hole, the pad comprising a through hole formed in the intermediate portion; and a via fill formed in the via hole, configured to fill the through hole, and coupled to the intermediate portion, wherein the via hole comprises opposing via holes formed to expose opposing surfaces of the intermediate portion of the pad, a pair of via fills connect to each other through the through hole, and the opposing surfaces of the intermediate portion of the pad are formed to be slope upwards toward the through hole.

5. A printed circuit board, comprising: an insulating layer comprising a via hole; a pad formed in the insulating layer such that an intermediate portion thereof is exposed by the via hole, the pad comprising a through hole formed in the intermediate portion; and a via fill formed in the via hole, configured to fill the through hole, and coupled to the intermediate portion, wherein the via hole comprises opposing via holes formed to expose opposing surfaces of the intermediate portion of the pad, a pair of via fills connect to each other through the through hole, and the intermediate portion of the pad tapers towards the through hole and slope upwards.

6. A method of manufacturing a printed circuit board, the method comprising: forming an insulating layer with a pad embedded therein, wherein the pad is formed at an intermediate portion of the insulating layer; selectively removing the insulating layer using an abrasive material to form a via hole having an hour-glass contour exposing an intermediate portion of the pad at an intermediate surface portion of the via hole; and filling the via hole with a conductive material to form a via fill, wherein the forming of the via hole comprises using the abrasive material to form a through hole in the intermediate portion of the pad.

7. The method of claim 6, wherein the forming of the via hole further comprises: disposing a mask having a through hole corresponding to a location of the via hole on the insulating layer; and performing a sandblasting process using the abrasive material on the insulating layer.

8. The method of claim 6, wherein the forming of the via hole comprises: performing a sandblasting process using the abrasive material on opposing surfaces of the insulating layer to form a pair of via hole connected to each other through the through hole to expose opposing surfaces of the intermediate portion of the pad; and forming a pair of via fills connected to each other through the through hole of the intermediate portion of the pad.

9. The method of claim 8, wherein the sandblasting process is simultaneously performed on the opposing surfaces of the insulating layer.

10. The method of claim 8, wherein the sandblasting process is sequentially performed on one surface and another surface of the insulating layer.

11. A printed circuit board, comprising: an insulating layer comprising a via hole having an hour-glass contour; a pad disposed at an intermediate portion in the insulating layer and configured to protrude a portion of the pad from side surfaces of an intermediate surface portion of the via hole, the pad comprising a through hole in the portion of the pad; and a via fill, disposed to fill the via hole and the through hole, and coupled to the portion of the pad.

12. The printed circuit board of claim 11, wherein the portion of the pad tapers towards the through hole.

13. The printed circuit board of claim 11, wherein the via hole comprises opposing via holes formed on opposing surfaces of the portion, and via fills connect to each other through the through holes.

14. The printed circuit board of claim 12, wherein the portion of the pad slope upwards towards the through hole.

15. The printed circuit board of claim 12, wherein the portion of the pad slope downwards towards the through hole.

16. The printed circuit board of claim 1, wherein the intermediate portion of the pad tapers.

* * * * *